(12) United States Patent
Thei et al.

(10) Patent No.: US 7,364,957 B2
(45) Date of Patent: Apr. 29, 2008

(54) METHOD AND APPARATUS FOR SEMICONDUCTOR DEVICE WITH IMPROVED SOURCE/DRAIN JUNCTIONS

(75) Inventors: Kong-Beng Thei, Hsin-Chu (TW); Chung Long Cheng, Hsin-Chu (TW); Harry Chuang, Austin, TX (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 88 days.

(21) Appl. No.: 11/490,012

(22) Filed: Jul. 20, 2006

(65) Prior Publication Data

US 2008/0020533 A1    Jan. 24, 2008

(51) Int. Cl.
*H01L 21/336* (2006.01)
*H01L 21/8234* (2006.01)
*H01L 21/8238* (2006.01)
*H01L 21/331* (2006.01)

(52) U.S. Cl. .............. 438/197; 438/199; 438/217; 438/218; 438/305; 438/353; 438/514; 438/524; 257/E21.431; 257/E21.507

(58) Field of Classification Search ........... 438/197, 438/199, 217–218, 305, 353, 514, 524; 257/E21.431, 257/E21.507

See application file for complete search history.

(56) References Cited

U.S. PATENT DOCUMENTS

| | | | | |
|---|---|---|---|---|
| 4,788,160 | A | * | 11/1988 | Havemann et al. ......... 438/305 |
| 5,516,711 | A | * | 5/1996 | Wang ........................ 438/217 |
| 5,972,762 | A | | 10/1999 | Wu |
| 5,998,839 | A | | 12/1999 | Cho |
| 6,017,801 | A | | 1/2000 | Youn |

(Continued)

OTHER PUBLICATIONS

Thompson, S., et al., "MOS Scaling: Transistor Challenges for the 21st Century," Intel Technology Journal Q3'98, pp. 1-19.

(Continued)

*Primary Examiner*—Michael Lebentritt
*Assistant Examiner*—Mohsen Ahmadi
(74) *Attorney, Agent, or Firm*—Slater & Matsil, L.L.P.

(57) ABSTRACT

A semiconductor device with improved source/drain junctions and methods for fabricating the device are disclosed. A preferred embodiment comprises a MOS transistor with a gate structure overlying a substrate, lightly doped source/drain regions formed in the substrate aligned to the gate structure, sidewall spacers formed on the sidewalls of the gate structure and overlying the lightly doped source/drain regions, deeper source/drain diffusions formed into the substrate aligned to the sidewall spacers and additional pocket implants of source/drain dopants formed at the boundary of the deeper source/drain diffusions and the substrate. In a preferred method, the additional pocket implants are formed using an angled ion implant with the angle being between 4 and 45 degrees from vertical. Additional embodiments include recesses formed in the source/drain regions and methods for forming the recesses.

20 Claims, 16 Drawing Sheets

U.S. PATENT DOCUMENTS

| | | |
|---|---|---|
| 6,165,880 A | 12/2000 | Yaung et al. |
| 6,191,462 B1 | 2/2001 | Chen-Hua |
| 6,207,519 B1 | 3/2001 | Kim et al. |
| 6,329,257 B1 | 12/2001 | Luning et al. |
| 6,368,926 B1 | 4/2002 | Wu |
| 6,498,067 B1 | 12/2002 | Perng et al. |
| 6,642,122 B1 | 11/2003 | Yu |
| 6,747,373 B1 | 6/2004 | Hu et al. |
| 6,870,179 B2 | 3/2005 | Shaheed et al. |
| 6,911,376 B2 | 6/2005 | Yoo |
| 6,914,309 B2 | 7/2005 | Koga |
| 2002/0048898 A1 | 4/2002 | Li |
| 2003/0073270 A1 | 4/2003 | Hisada et al. |
| 2004/0063289 A1 | 4/2004 | Ohta |
| 2005/0258515 A1 | 11/2005 | Chidambarrao et al. |
| 2006/0231826 A1 | 10/2006 | Kohyama |

OTHER PUBLICATIONS

Ge, C.-H., et al., "Process-Strained Si (PSS) CMOS Technology Featuring 3D Strain Engineering," IEDM, IEEE, 2003, pp. 73-76.

Thompson, S. E., et al., "A 90-nm Logic Technology Featuring Strained-Silicon," IEEE Transactions on Electron Devices, vol. 51, No. 11, Nov. 2004, pp. 1790-1797.

* cited by examiner

METHOD AND APPARATUS FOR SEMICONDUCTOR DEVICE WITH IMPROVED SOURCE/DRAIN JUNCTIONS

CROSS-REFERENCE TO RELATED APPLICATIONS

This application relates to the following co-pending and commonly assigned patent application Ser. No. 11/438,711, filed May 22, 2006, entitled "Transistors with Stressed Channels and Methods of Manufacture," which application is hereby incorporated herein by reference.

TECHNICAL FIELD

The present invention relates generally to a system and method for forming transistors in advanced semiconductor processes having contacts extending through a layer, typically a contact etch stop layer, including added implants in the channel region of a transistor to reduce the junction leakage that occurs in such devices fabricated with methods of the prior art. The transistors may be fabricated using intentionally induced tensile and/or compressive stress/strain layers to stress/strain the channel regions and therefore to enhance the carrier mobility of some or all of the devices. The contact etch stop layer may be used as the stress/strain layer. The transistors may also include recessed silicon areas on either side of the gate area to enhance performance. The transistors may include NMOS, PMOS transistors or in a complementary MOS process, the transistors formed using the inventive process and structures may include both types of devices, and may include enhancements to further increase performance such as retrograde wells, well halo implants, and graded source drain junctions. Epitaxial layers may be used as an alternative to a semiconductor substrate.

BACKGROUND

Generally, the minimum feature size fabricated in a particular semiconductor process is an objective measure that indicates how advanced, and how complex, that process is. Currently integrated circuits manufacturers may fabricate silicon integrated circuits using 65 nanometer (sometimes "65 nm") minimum feature size processes and are transitioning to 45 nanometers ("45 nm") processes in the immediate future, further advances will lead to processes with even smaller minimum feature sizes. Smaller minimum feature sizes increase the density of devices, increase the number of devices that may be incorporated into a single die, increase the switching speeds of the transistors and thus the performance of the integrated circuits produced using the process, and may increase the number of integrated circuits that can be produced on a single semiconductor wafer, thus lowering manufacturing costs and making increased performance possible at the same time.

One disadvantage of the prior art semiconductor devices is that as the fabrication processes shrink in size, undesirably increased junction leakage currents may occur due to the geometric features of certain regions that are formed adjacent to, or in proximity to, each other during the manufacture of, for example, MOS semiconductor transistor devices, which includes P channel MOS and N channel MOS transistors. Various approaches to improving the leakage current performance of these devices have been proposed, but these known approaches typically require extra processing steps, and therefore add additional cost and complexity to the processing methods; including the need for additional photolithographic masks and repeated use of photoresist, etch, implant and photoresist strip steps to achieve the desired geometric shapes in the finished devices.

Further the process tolerances and manufacturing variations that occur during processing may cause slight misalignment in certain process steps. Sometimes this slight misalignment results in a contact structure made to a source or drain diffused region actually forming slightly out of alignment, or forming slightly deeper than intended, and thereby electrically and/or physically contacting or forming very near a junction boundary between a diffusion region and a well region, which can increase the leakage current of the fabricated device. As the processes continue to shrink in size, this kind of leakage current becomes more prevalent and the resulting leakage current degrades the performance of the finished integrated circuits below the expected performance, and may even cause finished devices to be scrapped, the misalignment then increasing the costs of production of the integrated circuits by lowering the yield of the process.

FIG. 1 depicts an illustration, not to scale, in cross sectional view, of a conventional MOS device depicting one of either a P or N channel MOS transistor 1 fabricated using present processing techniques.

In FIG. 1, a substrate 3 which may be doped to a P or N type as is known in the art, is provided. Retrograde well 10 is formed which has the doping needed to support a channel for the MOS transistor, e.g. for an N channel transistor, the well is a P type, for a P channel transistor, the well is an N type dopant. The well is often doped with slow diffusing ions for example indium for N type devices, and arsenic or antimony for P type devices.

Standard features for a MOS transistor are shown, a gate oxide 7 is formed from a thermally grown or CVD deposited oxide layer or sometimes an oxide and a nitride is used, conductive gate 9 which can be formed of a conductive material such as a polysilicon material is formed. The gate material is used in a self aligned process and lightly doped drain (LDD) regions 11 are formed by implanting the correct dopant species (boron for N channel devices, phosphorous for P channel devices) and following the implant with a thermal anneal or sometimes a rapid thermal anneal. Halo implants 13 are performed and again use the slow diffusing species appropriate for the type of MOS transistor being formed, these slow diffusing halo implants prevent out diffusion of the more mobile implanted ions in the lightly doped drain regions (sometimes called "LDD" or, source drain extensions, "SDE") into the channel region by creating a guard region around and beneath the lightly doped drain. These implants may be performed at an acute angle to the vertical so that they can extend beneath the gate region.

Sidewall spacers 15 are formed on the gate polysilicon using conventional oxide and nitride deposition or thermal growth techniques. The sidewalls are then used during a second self aligned implant step to form the deeper source and drain diffused regions 17 using the appropriate dopant, boron or phosphorous, to complete the MOS transistor source and drain regions. Again slow or rapid thermal anneal steps may be used to drive and activate the dopants in the diffusion regions. Since the source and the drain of the transistor are symmetrical and which one is the source and which the drain is arbitrarily chosen based on the electrical connections made later, these regions are usually referred to simply as source/drain regions.

Following formation of the source/drain diffusion regions, a conductive metal such as titanium may be deposited over the diffusion regions to form a silicide, again a self aligned process is used, so that this is often referred to as a salicide layer, Layer 21 in FIG. 1 depicts the salicide regions which are formed over the polysilicon gate and the source and drain regions 17. Various known processes for forming the salicide 21 may be used. The formation of salicide over these regions results in a lower resistivity, improving performance of the finished transistor.

A contact etch stop layer (sometimes, CESL) 23 is applied over the structure to complete the intermediate structure for transistor 1 as shown in FIG. 1. This CESL layer 23 may also be used to apply physical stress or strain onto the channel region for the MOS device in order to increase carrier mobility and performance, as is known in the art. Shallow trench isolation (STI) regions 5 are shown and isolate the completed MOS transistor 1 from adjacent devices (not shown), also, as is known in the art, various other isolation methods such as field oxide regions may be used. The transistor 1 may be formed in a well first formed in a substrate, or, in an epitaxial layer formed over an insulator, such as an SOI structure, also as is known in the art.

FIG. 2 depicts the prior art transistor 1 of FIG. 1 in cross section after further process steps have been completed. In FIG. 2, an interlevel dielectric or isolation layer (sometimes referred to as ILO) 25 is formed over the CESL layer 23, this insulating layer may be formed of oxide or oxide and nitride layers as is known in the art. Interlevel dielectric layer 25 is subsequently patterned to form a via for a contact region which is then subsequently filled with a conductive material 29 to form contact over the source/drain region 17 and extending through the interlevel dielectric layer 25. A first level of metallization 27 is formed overlying the interlevel dielectric layer 25 and may be formed of aluminum or copper as is known in the art. This metallization layer overlies the top of and electrically contacts the contact 29 and forms an electrical connection to the source/drain region 17.

FIG. 2 also depicts the effects of misalignment as occurs in the prior art processing steps. Region 31 in FIG. 2 depicts the contact material extending almost through the lightly doped drain region 11 at a point near the boundary of the lightly doped drain 11 and the halo implant 13. In a more severe case, the contact material might extend completely through the lightly doped drain region. In any event, the contact 29 as shown in FIG. 2 is too near the boundary of the outer surface of the lightly doped drain diffusion region 11 with the halo implant 13, and thus junction leakage currents can flow from the source/drain contact 29 into the channel region, which is a failure caused by the misalignment. (Ideally, the contact 29 would end at or very near the surface of the source/drain region 17 and would not extend into the lightly doped drain region 11 as shown.)

FIG. 3 is a prior art drawing which depicts in cross section the region 31 and other features of the transistor 1 from FIG. 2 in a closer view, again this drawing is not to scale. The bottom and side edges of contact 29 are shown extending into the lightly doped drain region 11 and are formed very close to the outer boundary of the LDD region 11 and the well region where the halo implant 13 meets the LDD region. Again it can be seen that the contact 29 in this example is formed too near the LDD boundary. This proximity results in additional leakage current and correspondingly poor performance of the completed devices.

Certain prior art approaches to adding spacing in the gate sidewall area where the source/drain contacts are made adjacent a gate electrode sidewall are known. U.S. Pat. No. 6,207,519, to Kim et al., issued Mar. 27, 2001, describes a method of creating double sidewall spacers for a self aligned source contact in a MOS device by repeatedly performing implants, and anneals, growing a spacer on a sidewall of a gate electrode. Kim et al. provides additional spacing for the source contact away from the channel region. If this known process were applied to a CMOS device, it would require additional mask, photoresist, implant and strip steps for both the N-MOS and P-MOS transistors resulting in several additional processing steps. A second disadvantage of this approach is that the area used for each device is increased to increase the feature spacing, thus reducing the available silicon area (and therefore providing reduced device density). A similar approach is described in U.S. Pat. No. 6,165,880, to Yaung et al., which is assigned to the owner of the present application and which is herein incorporated by reference.

Additional engineering of the source/drain diffusions and the channel may be performed as is known in the prior art. The use of graded source drain junctions to reduce leakage current is known. U.S. Pat. No. 5,972,762, to Wu, issued Oct. 26, 1999, for example, describes the use of silicon recesses formed in the source drain regions adjacent a gate electrode to create a gradual source drain junction. The use of pocket implants, including angled implants, is known to create diffusions extending underneath the gate electrode or sidewalls, for example U.S. Patent Application Publication No. 2004/0063289A1, which published Apr. 1, 2004, describes angled implants to place dopants underneath sidewall spacers.

A continuing need exists thus for a MOS structure and fabrication methods for MOS devices to address the leakage current that results in prior art MOS transistors due to the proximity of the source/drain contact and the channel region. There is a need for a simple and economical way to reduce the leakage current and to increase the process tolerance of any misalignment that may occur in the manufacturing process. The methods and structures of the present invention address these needs.

SUMMARY OF THE INVENTION

These and other problems of the prior art are generally solved or circumvented, and technical advantages are generally achieved, by preferred embodiments of the present invention which provide, in a MOS transistor structure and methods for production, an additional angled implant of source/drain dopants into the substrate and placed generally in the area where the lightly doped drain diffusion meets the deeper source/drain diffusion region, and adjacent the well or substrate. This additional source/drain implant is performed contemporaneously with, prior to, or subsequent to the source/drain region ion implantation steps already being performed and thus no added masks, photoresist, strip or etch steps are required. The additional implant may be performed in situ with the source/drain ion implant steps conventionally used, so that no additional process chamber time, chamber cleaning, or wafer movements in and out of chambers are necessary. Alternatively the additional implant may be performed ex situ. No additional masking steps or other modifications are required to use the novel method and to form the novel structures of the invention. The novel transistor structure and method reduces leakage current and increases the tolerances to manufacturing variations in the devices with no additional costs, thereby increasing the productivity of the manufacture process and/or improving the performance of the finished devices.

In accordance with a preferred embodiment of the present invention, a method for forming a semiconductor device comprises forming isolation regions that define active areas, forming gate electrodes including a gate oxide overlying an active area and forming a gate conductor overlying the gate oxide, patterning the gate electrodes to form sidewalls, forming lightly doped source/drain diffusion regions in the active areas on either side of the gate electrodes, optionally performing an anneal process to drive the diffused dopants in the lightly doped source/drain regions underneath the gate electrodes, the lightly doped source/drain diffusions defining a channel region for a MOS transistor, forming composite sidewall spacers overlying the lightly doped source/drain diffusions and covering the sidewalls of the gate electrodes, and forming source/drain diffusions self aligned to the composite sidewall spacers, where the forming of the source/drain diffusions includes ion implantation that is vertical and aligned to the composite sidewalls, and angled ion implants that form source/drain pocket diffusions underneath and adjacent the lightly doped source/drain diffusions. A layer of insulating material is formed over the gate electrodes and the active areas, this may be a contact etch stop layer. A contact is formed extending through the insulating layer and making electrical contact to the source/drain diffusion regions. If this contact extends through the lightly doped source/drain diffusion region, the source/drain pocket diffusion will prevent excess leakage current from occurring. The insulating layer may provide physical stress/strain on the device and thereby enhance carrier mobility in the channel.

In accordance with another preferred embodiment of the present invention, a semiconductor device is provided comprising an active area in a semiconductor substrate isolated from other areas by isolation regions, a gate electrode comprising a gate conductor and a gate oxide overlying the active area, lightly doped source/drain diffusions formed in the substrate on either side of the gate electrode, composite sidewall spacers deposited over the lightly doped source/drain region and covering the sidewalls of the gate electrode, source/drain diffusion regions in the semiconductor substrate formed on either side of the composite spacers, source/drain pocket diffusions formed beneath and physically adjacent to the lightly doped source/drain regions, an insulating layer formed over the gate electrodes and the active areas, and a contact formed of a conductive material extending through the insulating layer and making electrical contact to the source/drain diffusion regions.

In accordance with a preferred embodiment of the present invention, a method for forming a semiconductor device comprises forming isolation regions that define active areas, forming gate electrodes including a gate oxide overlying an active area and a gate conductor overlying the gate oxide, patterning the gate electrodes to form sidewalls, forming lightly doped source/drain diffusion regions in the active areas on either side of the gate electrodes, optionally performing an anneal process to drive the diffused dopants in the lightly doped source/drain regions underneath the gate electrodes, the lightly doped source/drain diffusions defining a channel for a MOS transistor, forming recesses in the lightly doped source/drain diffusion regions by removing material in those regions, forming composite sidewall spacers over the recessed lightly doped source/drain diffusions and covering the sidewalls of the gate electrodes, and forming source/drain diffusions self aligned to the composite sidewall spacers, where the forming of the source/drain diffusions includes ion implantation that is vertical and aligned to the sidewall spacers and also includes angled ion implants that form source/drain pocket diffusions underneath and adjacent the lightly doped source/drain diffusions. A layer of insulating material is formed over the gate electrodes and the active areas, this may be a contact etch stop layer. A contact is formed extending through the insulating layer and making electrical contact to the source/drain diffusion regions. If, though misalignment of the process steps, this contact extends through the lightly doped source/drain diffusion region, the source/drain pocket diffusion will prevent excess leakage current from occurring that would have otherwise occurred between the contact and the channel region.

In accordance with a preferred embodiment of the present invention, a method for forming a plurality of CMOS devices comprises first forming isolation regions that define active areas for N and P type transistors, forming gate electrodes including a gate oxide overlying an active area and a gate conductor overlying the gate oxide, patterning the gate electrodes to form sidewalls, forming lightly doped source/drain diffusion regions in the active areas on either side of the gate electrodes using N type dopant atoms in the active areas for NMOS transistors and P type dopant atoms in the active areas for PMOS transistors, optionally performing an anneal process to drive the diffused dopants in the lightly doped source/drain regions underneath the gate electrodes, the lightly doped source/drain diffusions defining a channel for the MOS transistors, forming recesses in the lightly doped source/drain diffusion regions by removing material in those regions, forming composite sidewall spacers over the recessed lightly doped source/drain diffusions and covering the sidewalls of the gate electrodes. Then, in a symmetrical process method, covering the PMOS transistors by a photoresist layer and forming source/drain diffusions for the NMOS transistors self aligned to the composite sidewall spacers, where the forming of the source/drain diffusions includes ion implantation of N type dopants that is vertical and aligned to the sidewall spacers and angled ion implants of the same type dopants that form source/drain pocket diffusions underneath and adjacent the lightly doped source/drain diffusions. Next the NMOS transistors are covered by a layer of photoresist, the PMOS transistors are exposed, and source/drain diffusions including forming source/drain pocket diffusion regions is performed for the PMOS transistors using P type dopant atoms in an ion implanting step that is vertical implanting and angled implanting, either contemporaneously or performed sequentially. A layer of insulating material is formed over the gate electrodes and the active areas, this may be a contact etch stop layer. A contact is formed extending through the insulating layer and making electrical contact to the source/drain diffusion regions. If, though misalignment of the process steps, this contact extends through the lightly doped source/drain diffusion region, the source/drain pocket diffusion will prevent excess leakage current from occurring that would have otherwise occurred between the contact and the channel region.

Another preferred embodiment of the invention is a semiconductor structure including CMOS transistors including NMOS and PMOS transistors having isolation regions defining active areas, gate electrodes including gate oxides deposited over the active areas and gate conductors formed over the gate oxide and pattered to form sidewalls in the gate electrodes, lightly doped source/drain diffusions of a N type dopant atom formed for the NMOS transistors adjacent the sidewalls of the gate electrodes and lightly doped source/drain diffusions of a P type dopant atoms formed for the PMOS transistors adjacent the sidewalls of the gate electrodes, the lightly doped source/drain diffusions being annealed to drive these diffusions beneath the gate electrodes, recesses formed in the lightly doped source/drain diffusions to lower the top surface of the lightly doped source/drain diffusion beneath the bottom of the gate oxide for each of the transistors, composite sidewall spacers formed over the recessed lightly doped source/drain diffusions and covering the sidewalls of the gate electrodes, source/drain diffusions of N type dopant atoms for the NMOS transistors formed in the substrate aligned to the composite sidewall spacers, source/drain diffusions of P type dopant atoms for the PMOS transistors formed in the substrate aligned to the composite sidewall spacers, source/drain pocket diffusions of N type dopant atoms for the NMOS transistors formed by angle implants contemporaneously with or sequentially with the source/drain diffusions and placed beneath the lightly doped source/drain diffusions, and source/drain pocket diffusions of P type dopant atoms for the PMOS transistors formed by angle implants contemporaneously with or sequentially with the source/drain diffusions and placed beneath the lightly doped source/drain diffusions.

Preferred embodiments of the present invention may further include one or more additional performance improving features such as forming retrograde wells of low mobility well dopants underneath the gate electrodes prior to the formation of the gate electrodes, forming halo implants of well dopants prior to the formation of the lightly doped source/drain diffusions, using stress or strain to improve carrier mobility in the channel regions, and/or recessing the source/drain diffusions after the ion implantation step, each of these steps may be used with the present invention to create additional preferred embodiments, these steps may also be combined to create additional preferred embodiments in various combinations.

Another preferred embodiment of the invention forms an silicon on insulator layer by depositing an insulator layer, then forming an epitaxial layer of semiconductor material, prior to forming the isolation regions, gate electrodes, and source/drain diffusions including the source/drain pocket implants of the invention.

An advantage of a preferred embodiment of the present invention is that the junction leakage current is reduced over the prior art devices. By placing the added source/drain pocket diffusion at the location where the deeper source/drain diffusion meets the shallow lightly doped source/drain diffusion, current crowding effects and other junction effects are improved.

A further advantage of a preferred embodiment of the present invention is it improves the tolerance of the manufacturing method to misalignment, especially in forming the contacts for the source/drain terminals of the finished transistors. As the semiconductor processes continue to shrink, misalignment problems often result in the contact being formed in the lightly doped source/drain diffusion region. As this region is very shallow, the contact may extend into it, very close to the inner boundary of this diffusion with the channel, and in the prior art this may result in an unacceptable leakage current. The preferred methods of the invention advantageously provide greater tolerance by placing additional source/drain pocket diffusion at this critical area, and as a result the leakage current is prevented. Even if the contact extends to the bottom of the lightly doped source/drain diffusion, the device will still perform adequately with the added implants of the invention, thus improving the tolerance to misalignment and increasing the yields of the process.

Yet another advantage of preferred embodiments of the present invention is that they may be implemented in existing semiconductor processes at minimal cost. No added mask set is required, and unlike the prior art approaches of increasing the sidewall spacing or of making repeated implant, diffusion and strip steps, no additional photoresist and strip steps are required. The added angle implant of the invention may be performed contemporaneously with or in the same process chamber as the existing source/drain diffusion, and so the cost of implementing the invention is de minimis. The spacing between devices is not increased using the invention, and thus the device density is not impacted, in contrast to the approaches of the prior art.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

The drawings listed above are illustrative only and are not to scale, like numbers are used for like elements when possible.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various preferred embodiments in a specific context, namely an integrated circuit having complementary MOS (CMOS) devices fabricated using photomasks and photoresists so that a variety of devices, possibly including logic, memory, high voltage and low voltage transistors, FLASH and nonvolatile cells or dynamic memory cells can be incorporated into a single integrated circuit. The invention may also be applied, however, to other devices such as a pure NMOS or PMOS integrated circuit or a pure memory or logic integrated circuit as well. Certain enhanced features may be described which may be incorporated into and used in conjunction with the advantageous invention to create additional preferred embodiments, however these features are not essential to or necessary to use the invention and may be excluded from a particular embodiment. These features include enhancements known in the current advanced semiconductor art including retrograde well implants, halo well dopant implants, stress and strained layers to increase or improve carrier mobility, and the use of SiGe epitaxial layers, and recessed source/drain regions or so-called elevated gate structures.

The invention and the methods disclosed herein are also compatible with a variety of MOS devices that may incorporate sidewall spacers using various oxide and nitride combinations. Gate conductors may be formed traditionally using polysilicon, and metal gate structures including the use of damascene metals may be used. The methods and structures of the invention have application to, and advantages with, MOS devices generally irrespective of whether these additional features are utilized. The descriptions of these preferred embodiments do not limit the invention or the scope of the appended claims, and should not be read as limiting but are to be understood by the reader as illustrative examples.

Further the descriptions of the process steps that follow to form the transistors including forming isolation, gate oxide, gate conductor, sidewalls, lightly doped source/drain regions, and the deep source/drain diffusions, for both N and P channel MOS transistors, are conventionally known and those skilled in the art will recognize that although exemplary descriptions are given for process steps, dopants, temperatures, implants, concentrations of dopants, types of anneal and diffusions, patterning by etch, many well known alternatives may be used and these alternative known approaches are within the scope of the invention and the appended claims.

Figure 3:
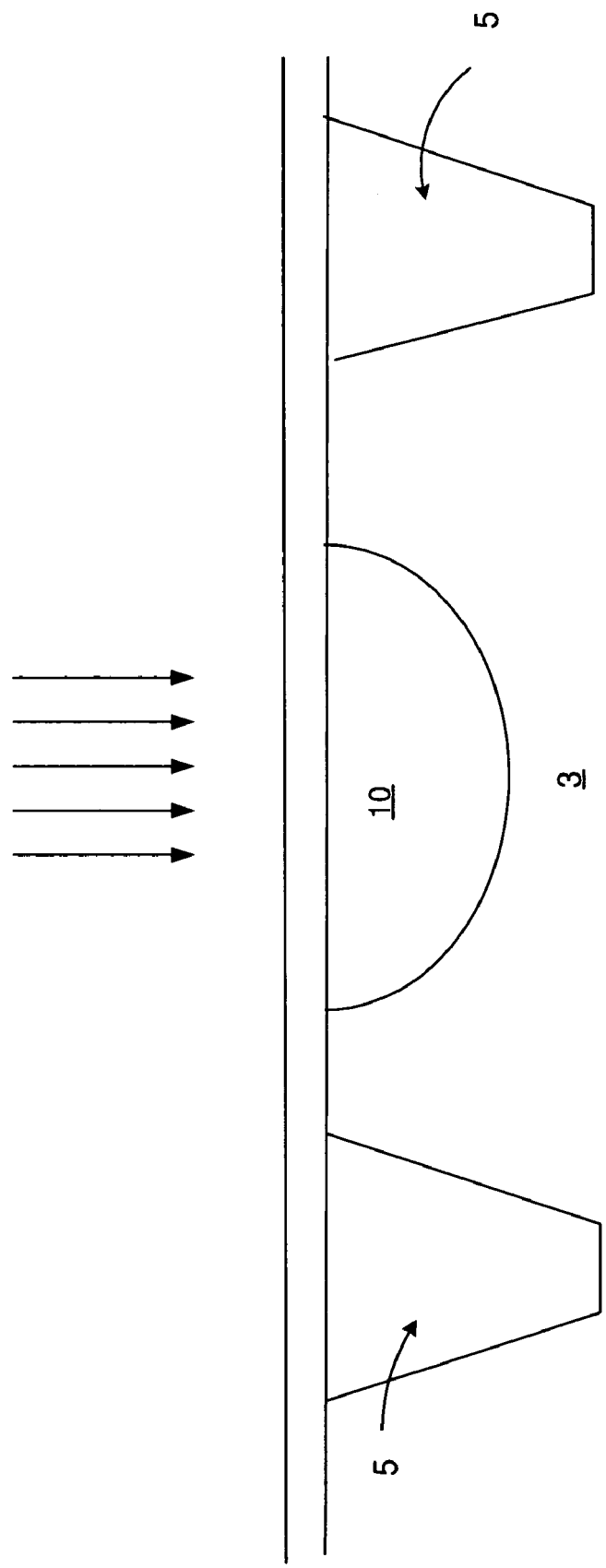
FIG. 3 illustrates in a representative cross section a semiconductor substrate having an active region for forming a MOS transistor of a preferred embodiment during an implant step.

FIG. 3 depicts a cross sectional view of a substrate or epitaxial semiconductor region 3 having shallow trench or other conventional isolation regions 5 formed within substrate 3 to define an active area for fabricating a single MOS transistor. In a typical device many thousands of such transistors will be formed. In FIG. 3 the downward directed arrows indicate the step of forming a retrograde well 10 in the active area by ion implanting the appropriate dopant ions for the well type. For example, for an N channel MOS transistor, the well dopant may be a slow diffusing P type species such as indium. For a P channel MOS transistor, the well dopant may be a slow diffusing N type species such as arsenic or antimony. In a CMOS process, a preferred embodiment, the retrograde well may be used for one type of transistor, for example the NMOS transistor, while the well for the other transistor type, for example the PMOS transistor, may use the substrate doping itself for the channel region. Alternatively both transistor types may have retrograde wells. Annealing may follow the implant, as is known, to activate the implanted ions and to repair any damage to the crystal lattice structure the ion implant step may have caused, the anneal could include various known approaches such as rapid thermal annealing (RTA), laser annealing, etc.

The appropriate well dopant ions will be, for example, implanted to a concentration of $1 \times 10^{13}/cm^2$ to $5 \times 10^{14}/cm^2$ in an example using indium (In+) as the implanted dopant for the retrograde well (p type) for NMOS transistors. Similar concentrations of antimony dopant could be used to form a retrograde well for the PMOS transistors. Typically, the substrate has a type (N or P) and thus additional well doping is only required for one type of transistor. For an N type substrate, only the NMOS transistor requires additional well doping for the channel to form correctly. It is desirable to use low mobility well dopants to reduce the spreading effect that may occur when additional process steps are performed, as thermal annealing steps are performed later in the process, the well dopants need to remain in their original locations.

Figure 4:
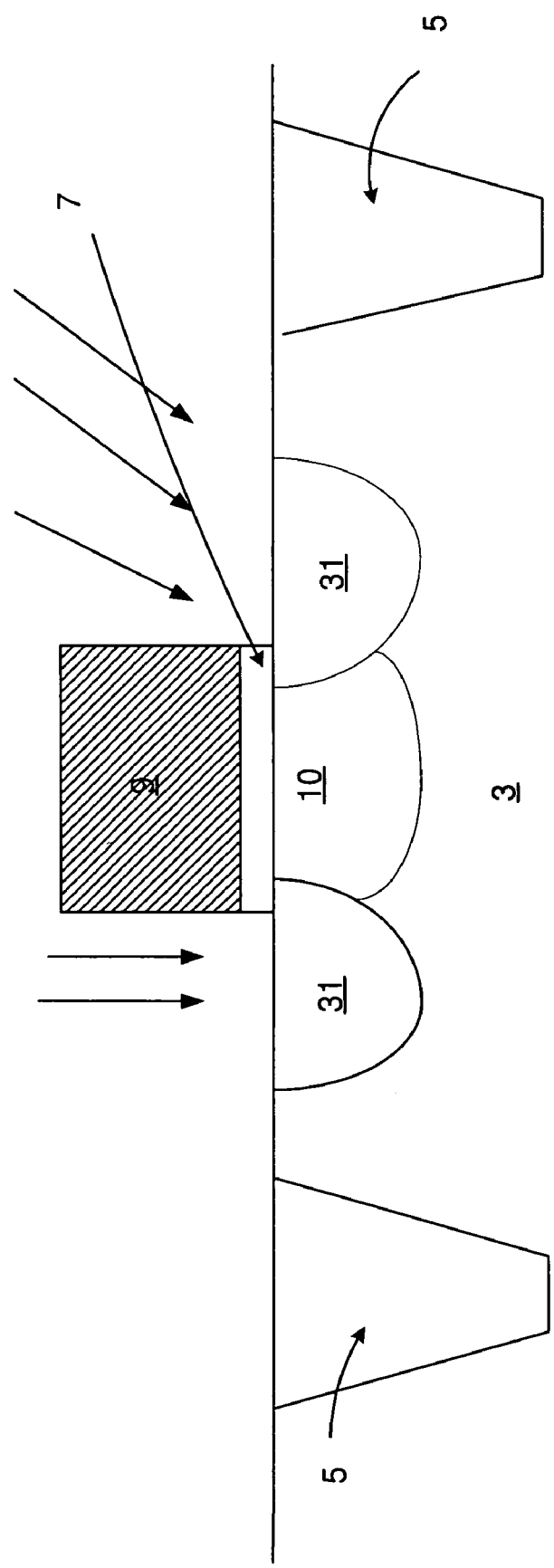
FIG. 4 illustrates in a representative cross section the MOS transistor of FIG. 3 following some additional manufacturing steps.

FIG. 4 depicts the cross sectional view of the substrate 3 of FIG. 3 following the steps of formation of a gate oxide, a gate electrode, and patterning the gate electrode, with the arrows indicating the process for forming so-called "halo" implants of additional well dopants. These "halo" implants are performed to further enhance the performance of the devices by controlling the source-drain and channel profiles. These "halo" implants are not necessary for the use of the invention but are preferred in present advanced processes. Halo implants are performed using the well dopants, as above for the retrograde wells, and angled implants may be used to form the halo dopants beneath the gate structure. Halo diffusions 31 are thus formed adjacent, and underneath, the gate electrode. Typically, the depth of this implant may be 100-1500 Angstroms.

As is known in the art, the gate oxide 7 may be formed by a number of methods for depositing an oxide layer, including without limitation thermal oxidation, thermal oxidation followed by nitridation, chemical vapor deposition (CVD), plasma enhanced CVD (PECVD), sputtering or other techniques known to those skilled in the art. The oxide layer may be a simple oxide, such as silicon dioxide ($SiO_2$), silicon nitride, or silicon oxynitride. Alternatives are the use of high K dielectrics, such as for example aluminum oxide, hafnium oxide, zirconium oxide, hafnium oxynitride, hafnium silicate, zirconium silicate, lanthanum oxide and various combinations thereof. A deposited oxide or nitride layer preferably has a thickness in the range of 8 to 100 Angstroms, and a preferred embodiment ranges from 8 to 10 Angstroms. A high K dielectric used in an alternative preferred embodiment should have an equivalent oxide thickness of between 8 and 100 Angstroms.

The gate electrode 9 is comprised of conductive material that may include polysilicon, polycrystalline silicon germanium, a refractory metal such as molybdenum, nickel, platinum, tungsten, compounds that are conductive such as titanium nitride, or other conductive metals. Metal gates may be used, and damascene processed metals may be used.

Subsequent to the halo implants, and in a preferred embodiment, performed using the same chamber, using the same photoresist, and thus not requiring any additional masks, photoresist deposit, strip and etch steps, the lightly doped source/drain diffusion implant is performed to form the diffusion regions 18. Because the source and drain of the MOS device are, structurally, symmetrical and which terminal is which depends not on the structural characteristics but rather on the electrical connections of the finished transistor, these diffusions are referred to in this document as "source/drain" diffusions. Some in the art refer to these lightly doped source/drain diffusions, which when complete extend underneath the gate structure, as "source drain extensions" or SDE regions.

Figure 5:
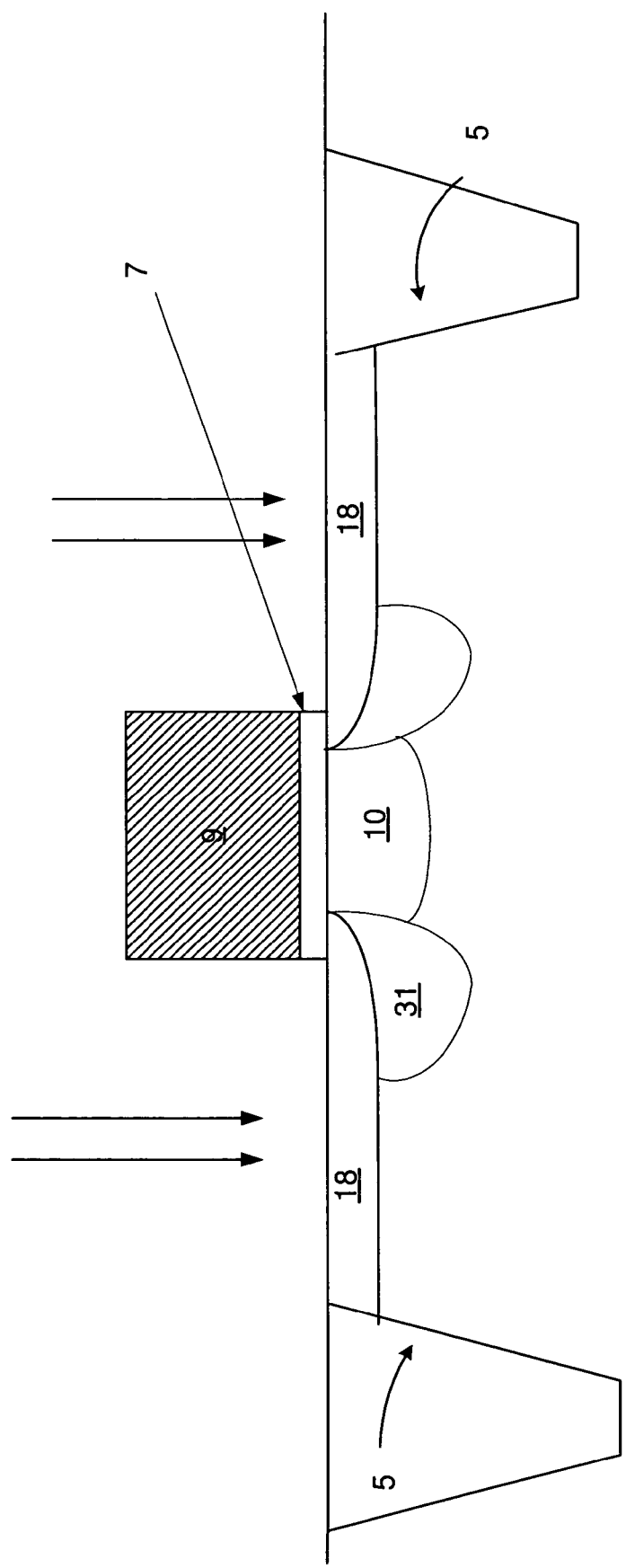
FIG. 5 illustrates in a representative cross section the MOS transistor of FIG. 4 following some additional manufacturing steps.

FIG. 5 depicts in cross section the transistor structure of FIG. 4 while the lightly doped source/drain diffusions are being implanted. These diffusions may be performed, as suggested by FIG. 5, by an ion implant step and the dopants are those typically used for source/drain regions, for an N channel MOS transistor the dopants may be phosphorous or arsenic, for a P channel MOS transistor the dopants may be boron or boron fluoride ($BF_2$); the concentrations in the lightly doped source/drain diffusion regions may be $3\times10^{14}/cm^2$, for example. Following the implant step, the substrate may be subjected to a rapid thermal anneal, laser anneal or other annealing step to cause the dopants to diffuse underneath the gate region, and to repair any damage to the crystal lattice structure caused by the impact of the implanted ions, as is known in the art. For example, a rapid thermal anneal at an elevated temperature of between 950-1100 degrees Celsius may be used, with a temperature of around 1020 degrees Celsius preferred. For a CMOS process, it is to be understood that the ion implanting steps must be performed using appropriate photoresist deposit and strip steps to implant the N type dopant atoms for N channel transistors, and then, to implant the P type dopant atoms for P channel transistors, as is known in the art, followed by the anneal steps to drive the diffusions underneath the gate and to repair any lattice damage caused by the implant steps.

Figure 6:
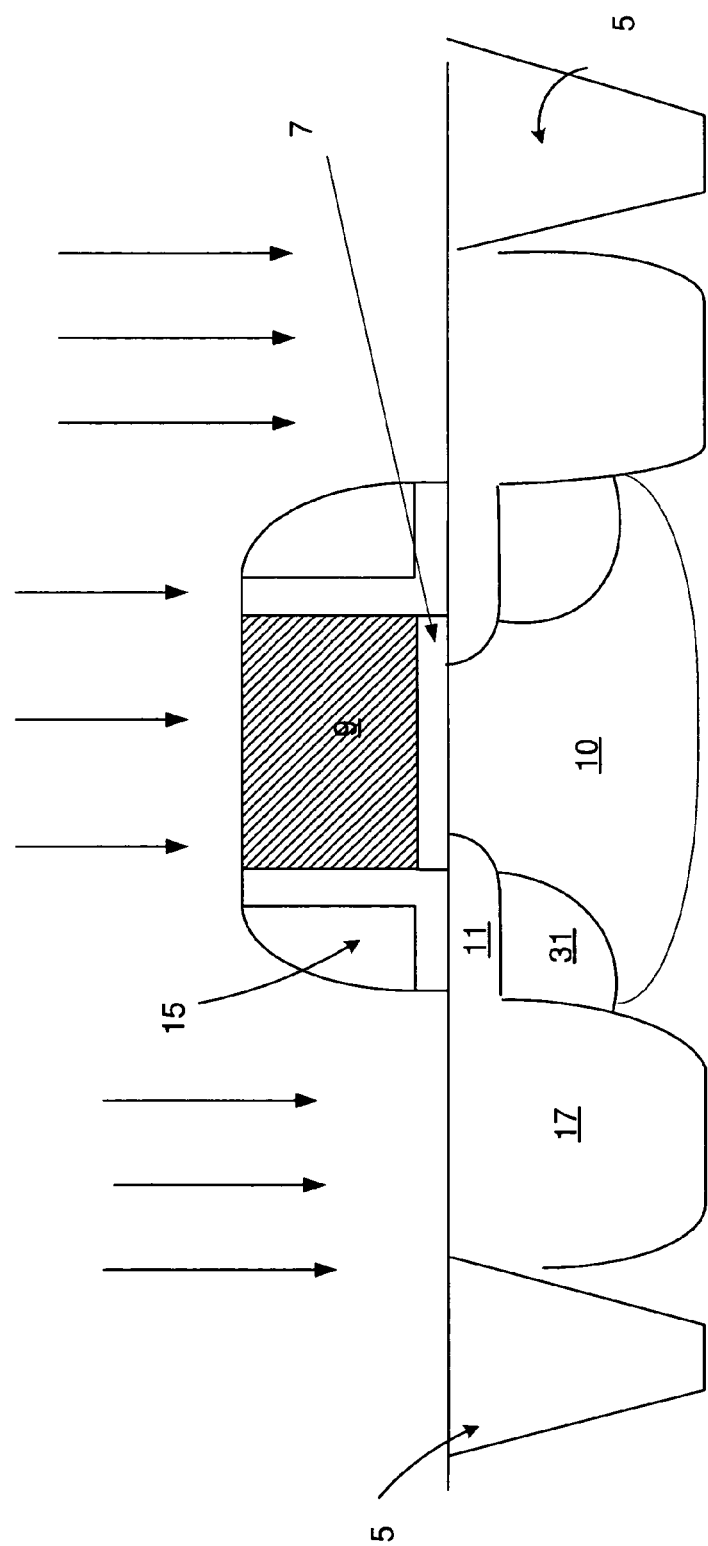
FIG. 6 illustrates in a representative cross section the MOS transistor of FIG. 5 during another implant step.

FIG. 6 depicts the transistor 1 of FIG. 5 following the formation of sidewall spacers 15 on the gate structure and during the implant step for the deeper source/drain diffusions 17. A variety of sidewall spacers may be used in conjunction with the invention, the embodiment shown here is a two part spacer 15 formed of a nitride deposition which is generally "L" shaped and adjacent the gate electrode 9, and an oxide overlying the L shaped nitride. These spacers may be formed by deposit and etch steps for oxides or nitrides as is known in the art. In other embodiments described in detail below, the spacers may be a single material such as an oxynitride, or composites comprising oxide nitrides as shown (ON), oxide nitride oxide layers (ONO), oxide nitride nitride layers (ONN), oxide nitride oxide nitride layers (ONON), and may be bell shaped as depicted in FIG. 6, or L shaped, or other shapes may be used as is known in the art. The spacers may have varying widths and control of this width may be used to control certain critical dimensions, for example, the spacing of the lightly doped source/drain region and the deeper source/drain diffusions, to be formed next, may depend on the spacer dimensions.

FIG. 6 depicts the cross section during the source/drain diffusion implant step. This ion implant is performed to produce source/drain diffusions 17 which are deeper than and have higher dopant concentrations than the lightly doped source/drain diffusion 11, formed earlier. Preferably similar dopant atoms can be used, that is, for N channel MOS transistors, arsenic or phosphorous may be used, for P channel MOS transistors, boron or $BF_2$ may be used; also other dopants may be used as is known in the art. This implant may be performed simultaneously with next implant step, or the steps may be performed in a sequential series of steps. Further, while it would be preferred to perform this step and the next step in a single chamber, it is possible to vary this method and use different chambers, as is known in the art. The source-drain implant may be, for example, for NMOS phosphorous or arsenic and a depth of around 100 A to 1500 A, and for PMOS boron or boron fluoride or indium and to a depth of around 100 A to 1500 A.

Figure 7:
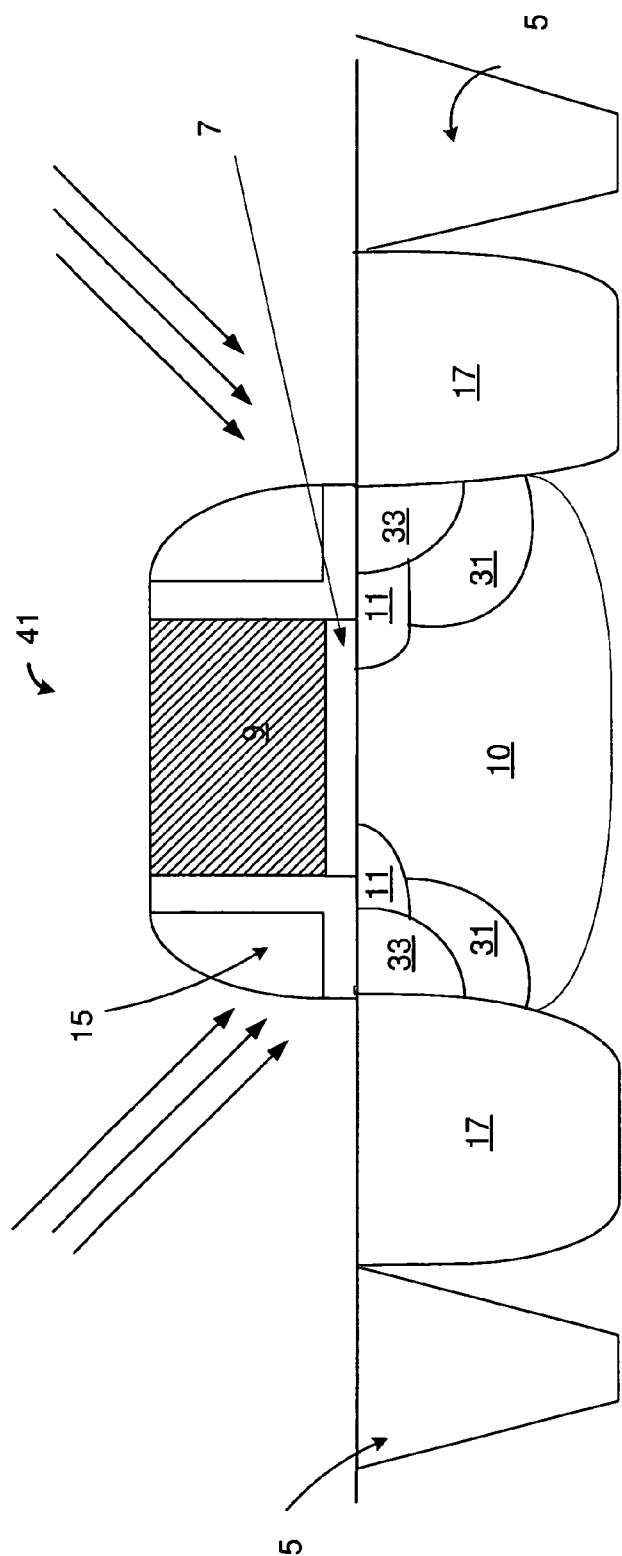
FIG. 7 illustrates in a representative cross section the MOS transistor of FIG. 5 during an angled implant step.

FIG. 7 depicts in cross section the transistor structure of FIG. 6 during the angled implant of additional source/drain dopant atoms, which is a preferred embodiment of the invention. Transistor 41 includes source/drain pocket diffusions 33 that are formed by an angled ion implant, where the angle varies from 5 to 45 degrees from vertical (that is, vertical is 0 degrees). The pocket diffusions 33 of dopants are generally formed in the region where the deeper source/drain diffusion 17 meets the lightly doped source/drain diffusion 11 and adjacent the halo implants 31 (if present) or the well material. The implanted ions are preferably the same species as used for the deeper source/drain implants 17, but in an alternative embodiment may be a different species. This angled implant step is preferably performed using the same photoresist mask and in the same implant chamber as the deeper source/drain diffusion implant, so that no added photoresist mask, deposit and strip steps are needed to implement this step. No additional wafer cleaning, wafer transport or preparation steps are required to accomplish this angled implant are required, so that this novel method step is economical to implement in existing semiconductor processes. The implant will result in source/drain diffusions 33 which may have a depth of from about 50 Angstroms to about 1800 Angstroms, and a width from about 0.01 microns to about 10 microns. The concentration of the dopants for NMOS is phosphorous or arsenic from $1\times10^{14}/cm^2$ to $5\times10^{15}/cm^2$, and for PMOS boron or $BF_2$ from $1\times10^{14}$ to $5\times10^{15}/cm^2$.

Following the completion of the deeper and pocket source/drain implants, a rapid thermal anneal, such as is described above is performed to repair any damage caused by the implant and to activate the dopant ions. This may be preferably performed at about 1020 degrees Celsius, for example. Other anneals such as a laser anneal or conventional anneal cycles could be performed as described above.

Figure 8:
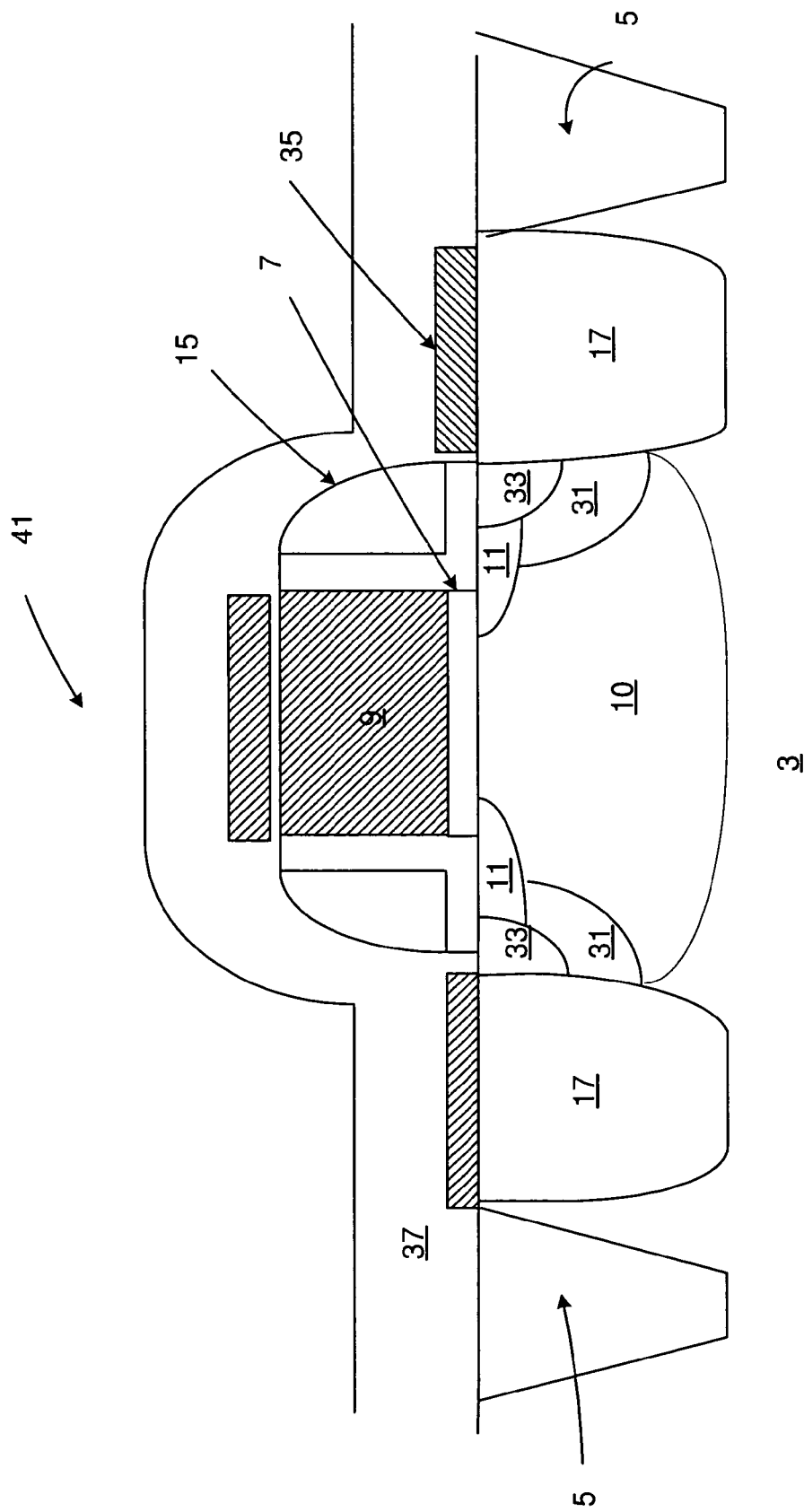
FIG. 8 illustrates in a representative cross section the MOS transistor of FIG. 7 following some additional manufacturing steps.

FIG. 8 depicts in cross section the structure of transistor 1 following the formation of the self aligned silicide (sometimes called salicide) layers 35 over the source/drain diffusions 17 and the gate electrode 9, the deposition of the stress/strain layer 37 which may be a contact etch stop layer (CESL) for example, or other stress/strain layer. The deposition of the metal to form the silicide layers is well known in the art and may include depositing metals such as nickel, erbium, platinum, and the like. The stress layer 37 which may be a contact etch stop layer (CESL) may be formed by conventional deposition methods such as low-pressure CVD (LPCVD), plasma enhanced CVD (PECVD) or other methods known in the art for depositing stress layers such as a silicon nitride or other stress inducing layers.

Figure 1:
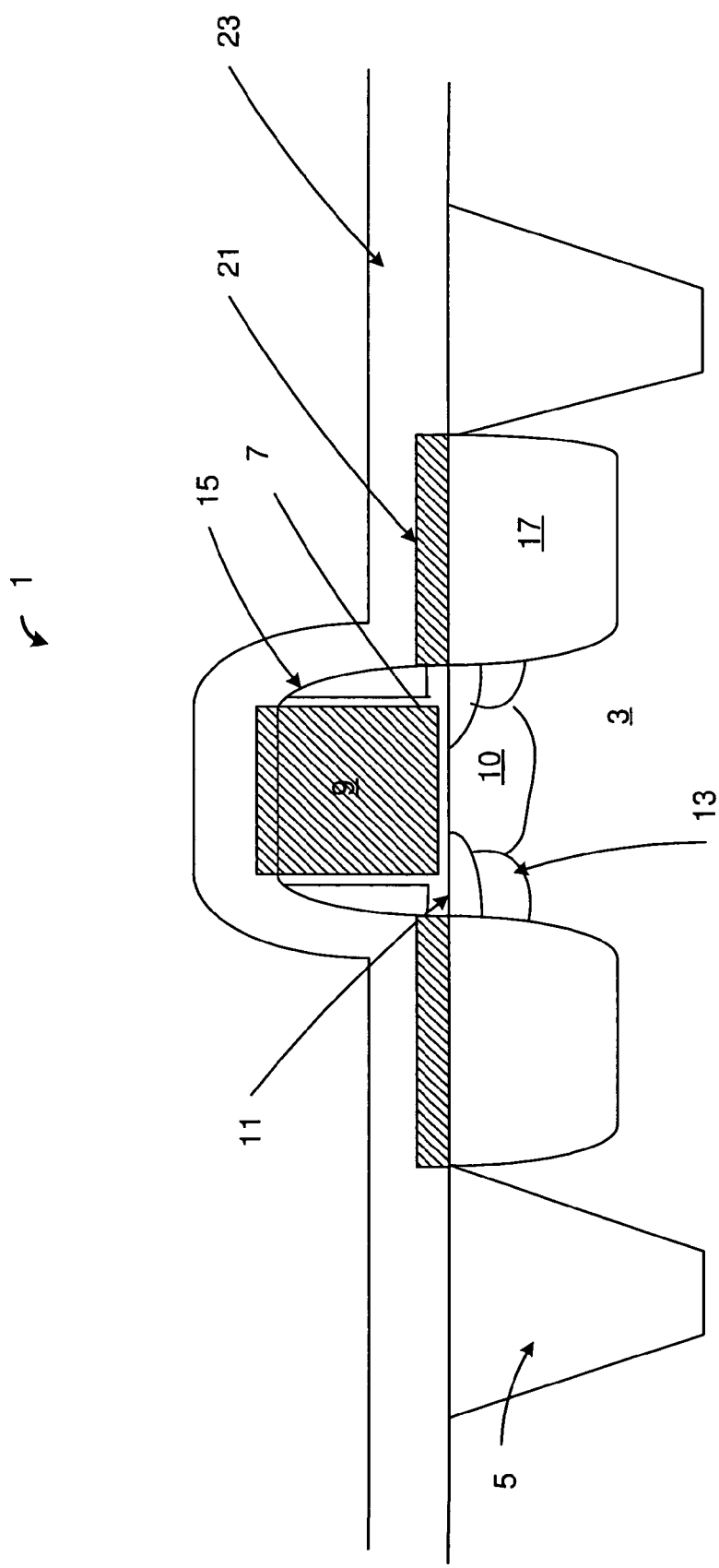
FIG. 1 illustrates in a representative cross section a MOS transistor of the prior art in an intermediate stage of completion.
Figure 2:
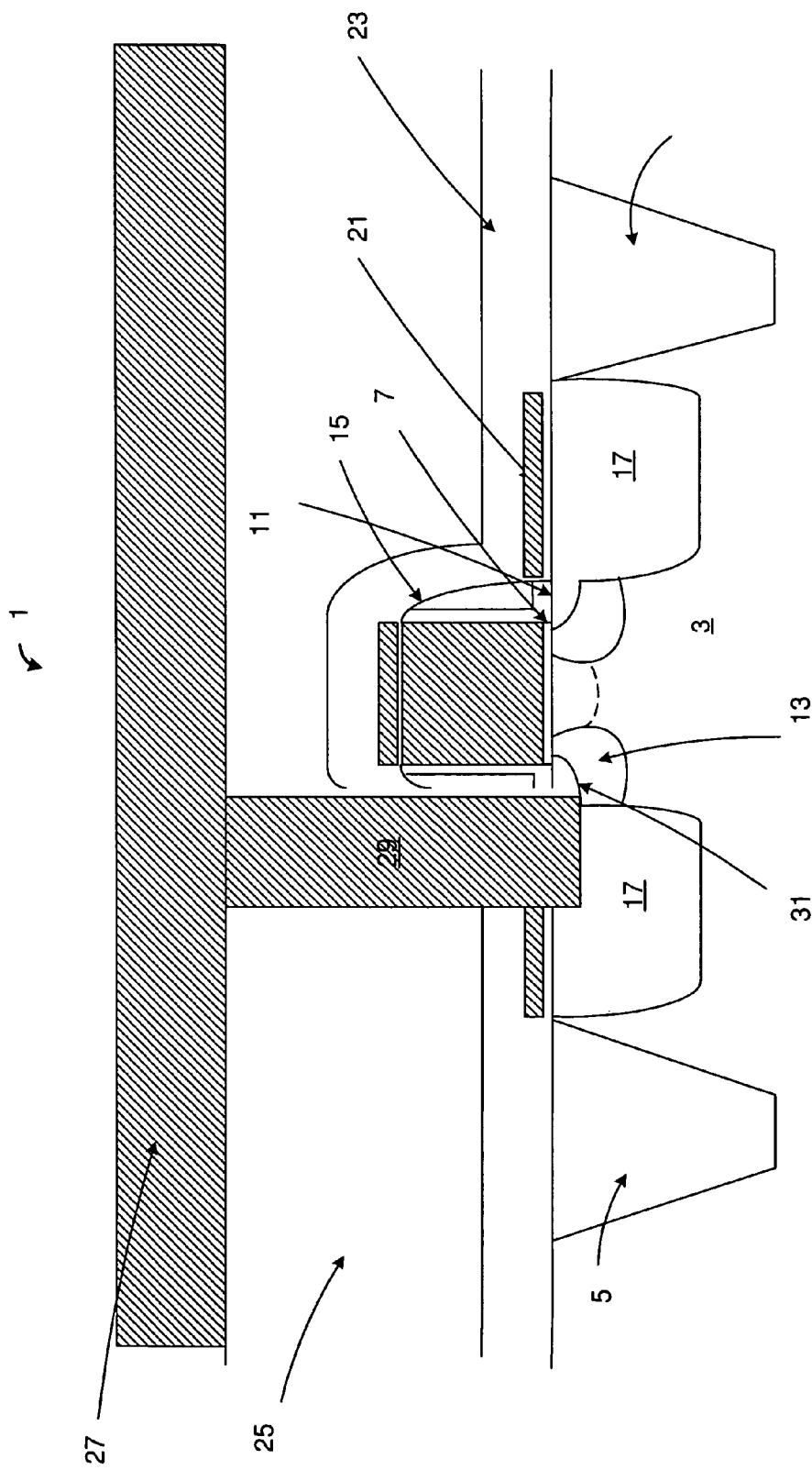
FIG. 2 illustrates in a representative cross section the MOS transistor of FIG. 1 following additional manufacturing steps.
Figure 9:
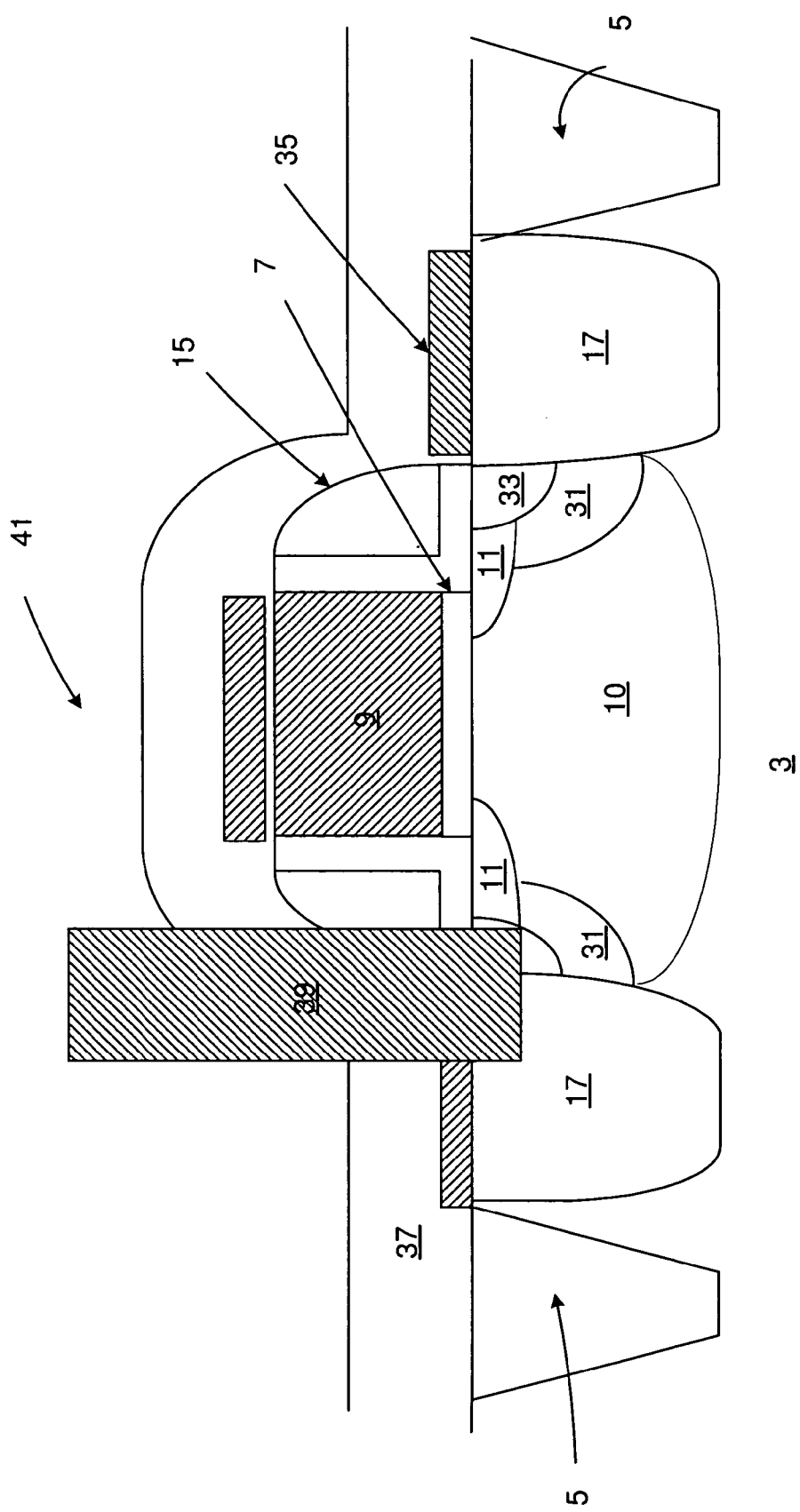
FIG. 9 illustrates in a representative cross section the MOS transistor of FIG. 8 after formation of a contact.

FIG. 9 depicts in cross section the structure of transistor 41 as shown in FIG. 8 following the formation of a conductive contact 39 to the source/drain diffusion regions 17 using known pattern, etch and fill techniques to form a contact of a conductor, usually a metal such as aluminum, copper or the like. In FIG. 9 contact 39 extends through the stress layer 37 to a depth equal to or even greater than the bottom of the lightly doped source/drain layer 11, and the advantage of the added source/drain pocket diffusions 33 of the invention can now be seen. The bottom of the contact 39 falls within the added pocket diffusion 33, preventing the formation of a current leakage path from the contact directly to the channel in the well region. In contrast to the prior art contact of FIG. 2, there is no path for the current to flow and thus the junction leakage current is reduced. The process therefore can tolerate misalignment of the position of the contact, as well as variation in the depth of the contact, better than transistors fabricated in the prior art processes.

Figure 10:
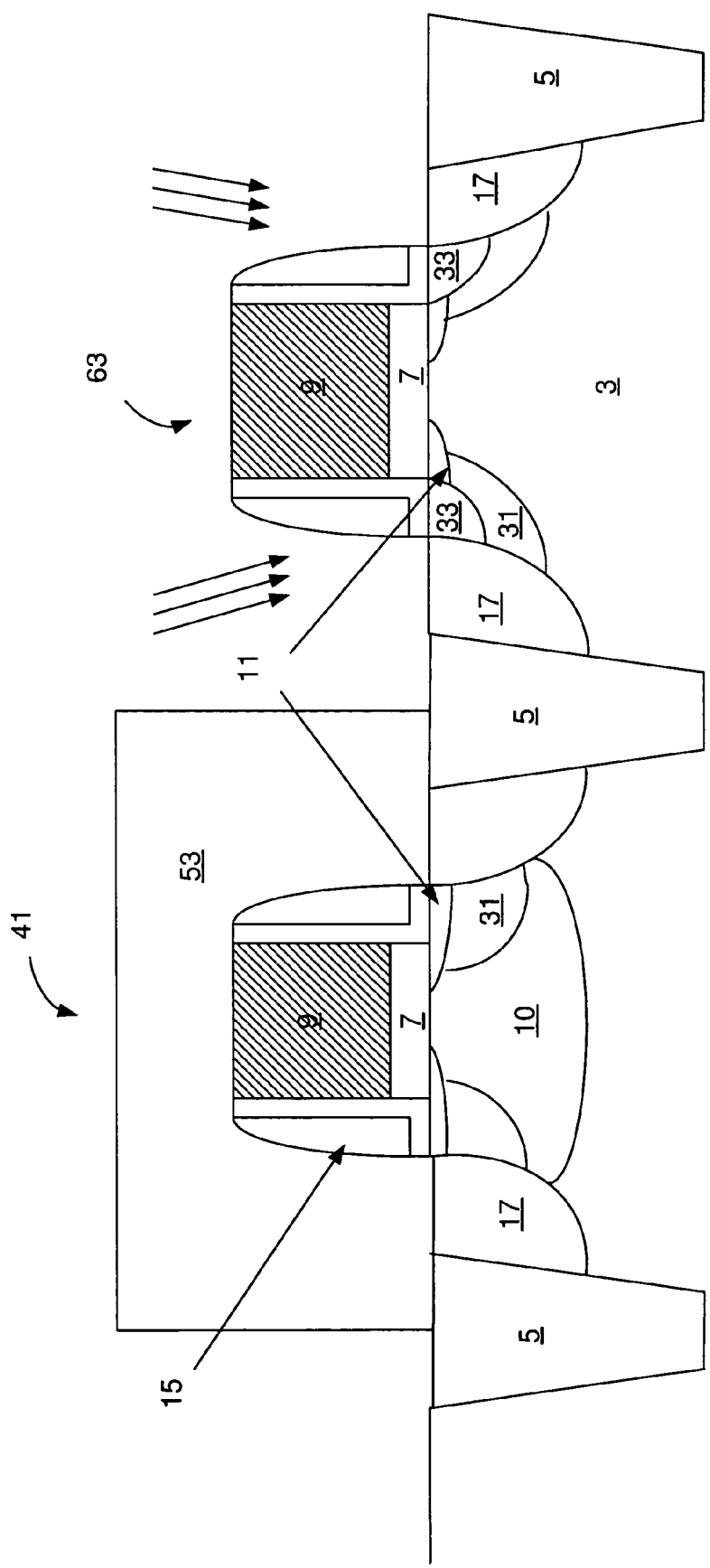
FIG. 10 illustrates, in a representative cross section, an angled implant being performed on a transistor in a CMOS manufacturing process in another preferred embodiment of the invention.

FIG. 10 depicts in cross section an intermediate step in forming another preferred embodiment of a CMOS transistor structure incorporating the source/drain pocket diffusions of the invention. In FIG. 10, N channel MOS transistor 41 is depicted and formed up to the deeper source/drain diffusion step and covered by a layer of photoresist 53. P channel MOS transistor 63 is depicted being implanted with the source/drain pocket implant to form pocket diffusions 33 as described above. P channel MOS transistor is being implanted with dopants of a P type, for example, boron or $BF_2$; other P type dopant atoms could be used.

Figure 11:
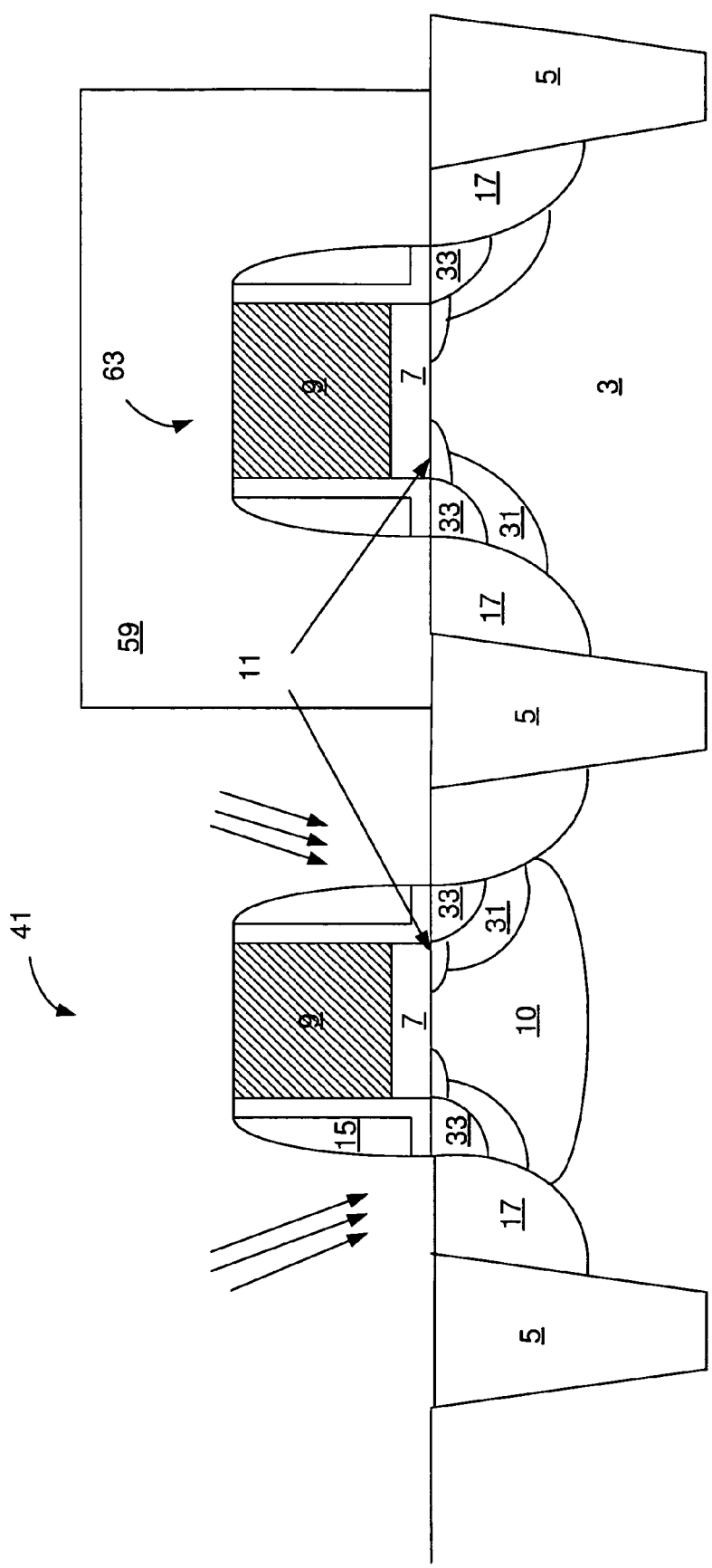
FIG. 11 illustrates in a representative cross section, an angled implant being performed on another transistor in the CMOS structure of FIG. 10.
Figure 12:
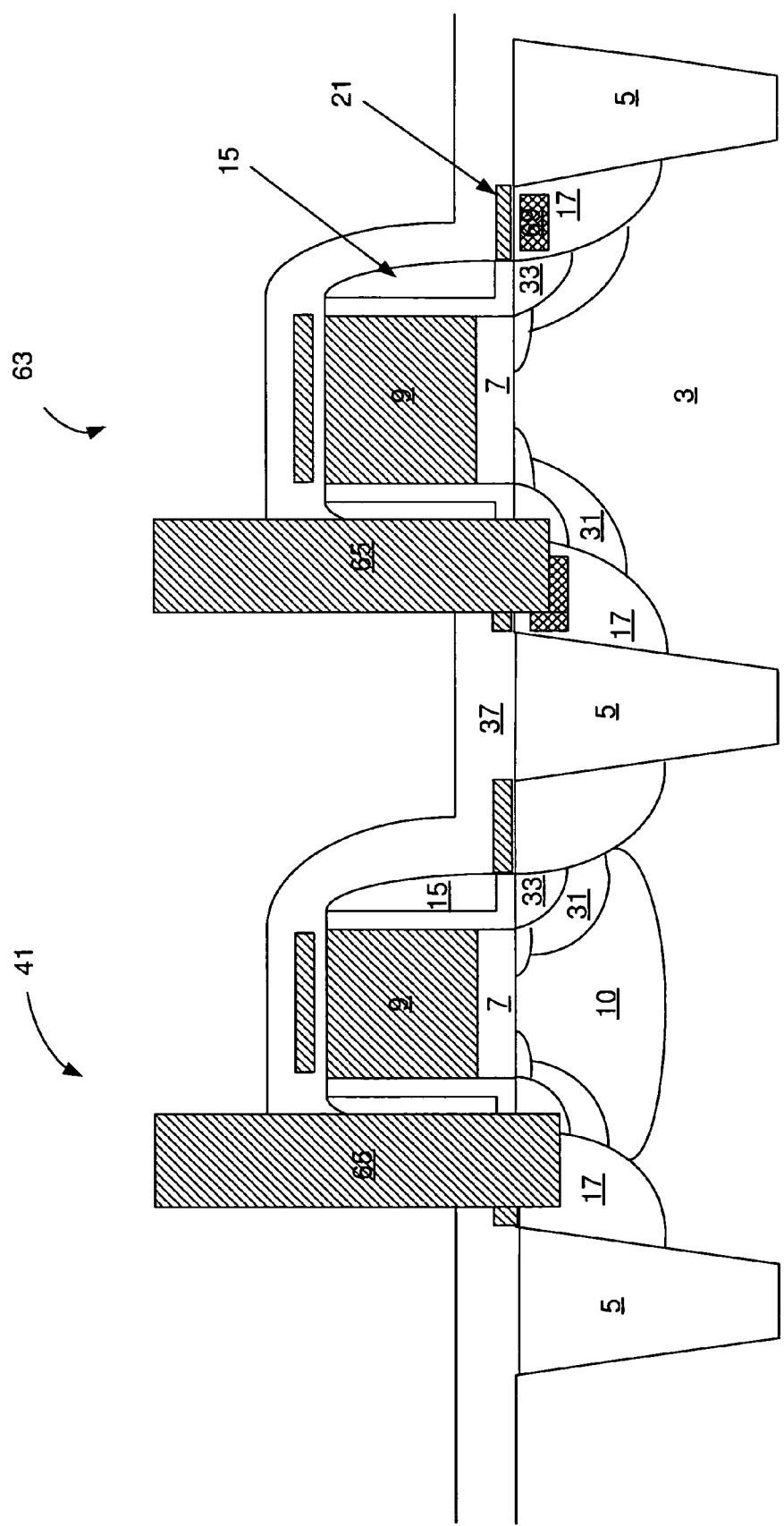
FIG. 12 illustrates, in a representative cross section, a completed CMOS structure in another preferred embodiment of the invention.

FIG. 11 depicts a step following the step of FIG. 12, of course the order of these steps is flexible and a different order could be used. In FIG. 11, the P channel MOS transistor 63 with the completed pocket source/drain diffusions is covered by a layer of photoresist 59, the layer of photoresist 53 has been removed from the N channel MOS transistor 41 and the source/drain pocket diffusion is shown being performed. For N channel MOS transistor 41 N type dopants such as phosphorous or arsenic may be implanted to form source/drain pocket diffusions 33.

FIG. 12 depicts the CMOS transistors 41 and 63 of FIGS. 10, 11 in a further cross sectional view. In FIG. 12 the salicide layers 21 are completed, a stress layer such as a contact etch stop layer 37 as described above is formed over the structures, and source/drain contacts 65 are shown formed extending through the CESL layer 37 and into the diffusions for both transistors. As a further preferred embodiment the use of silicon germanium (SiGe) 69 implanted into the deeper source/drain diffusions 17 for the P channel MOS transistor are shown, these SiGe source/drain implants 69 further enhance the performance of the P channel MOS transistors. As is known to those skilled in the art, for a particular process node, typically the P channel MOS transistors are more resistive than the N channel MOS transistors resulting in an asymmetrical performance of the devices. In order to balance the N and P channel device performance of the N and P channel transistors and to create symmetrical performance of the paired devices, additional steps must be taken to improve the performance of the P channel transistors. SiGe implants 69 are used as one method of accomplishing this desired feature.

The transistor structures of FIGS. 3-12 above depict simplified views of certain preferred embodiments. Co-pending and commonly assigned U.S. patent application Ser. No. 11/438,711, entitled "Transistors with Stressed Channels and Methods of Manufacture", filed May 22, 2006, which is incorporated herein by reference, discloses the use of stress/strain layers along with recessed areas in the silicon source/drain regions to further enhance the transistor performance. In preferred embodiments of the present invention, recesses may be formed in either the lightly doped source/drain regions, or, in both of the lightly doped source/drain and deeper source/drain diffusion regions, in conjunction with the angled source/drain pocket implants described above, to even further enhance the performance of MOS transistors so produced.

Figure 13:
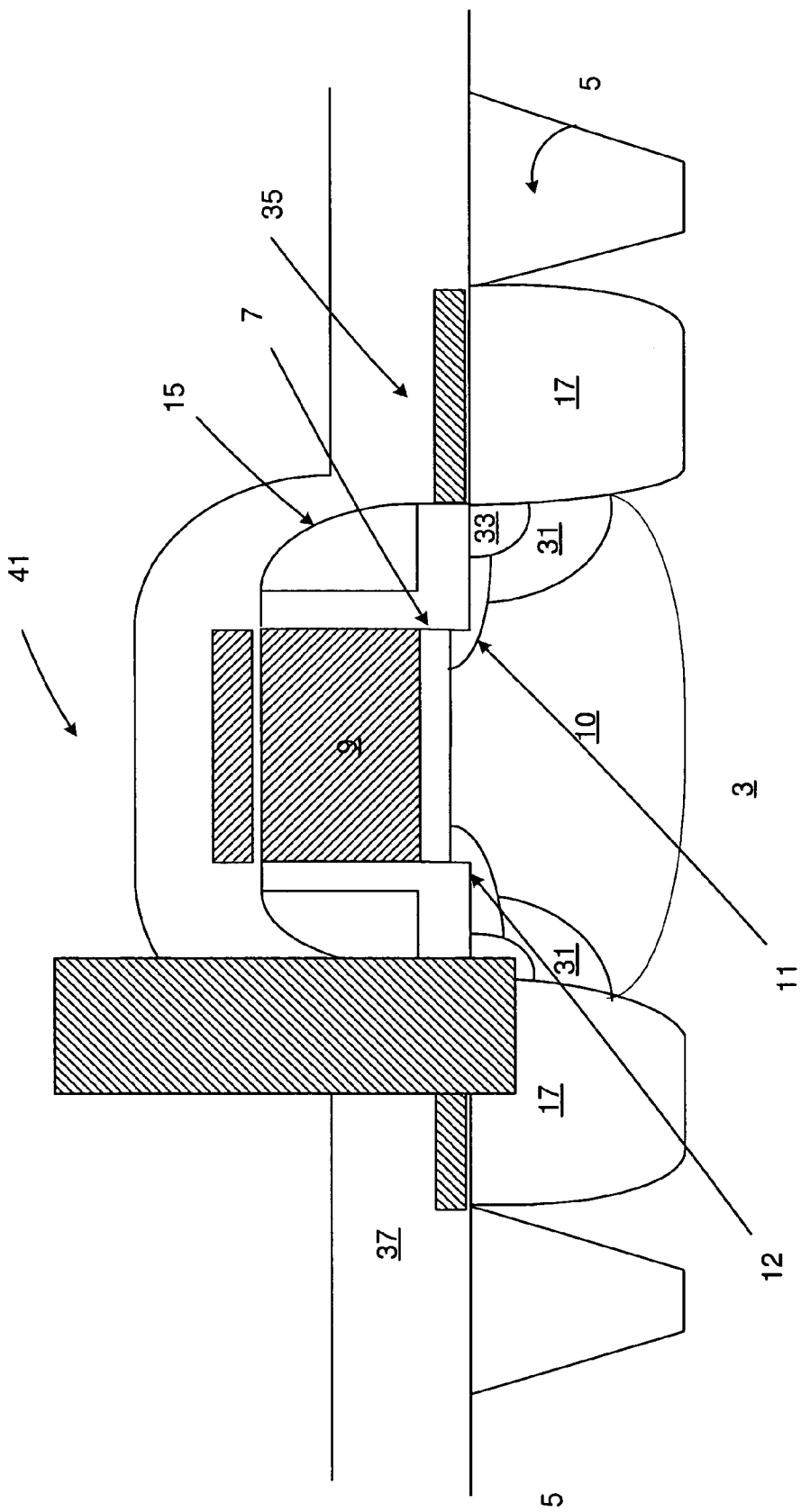
FIG. 13 illustrates, in a representative cross section, another preferred embodiment including a MOS transistor having recessed lightly doped source/drain regions.

In FIG. 13 a cross sectional view of another preferred embodiment of a MOS transistor is shown. Here, transistor 41 incorporates the source/drain pocket implants 33 and the methods described above and are further depicted with the preferred recesses 12 formed in the lightly doped source/drain regions 11.

Figure 14:
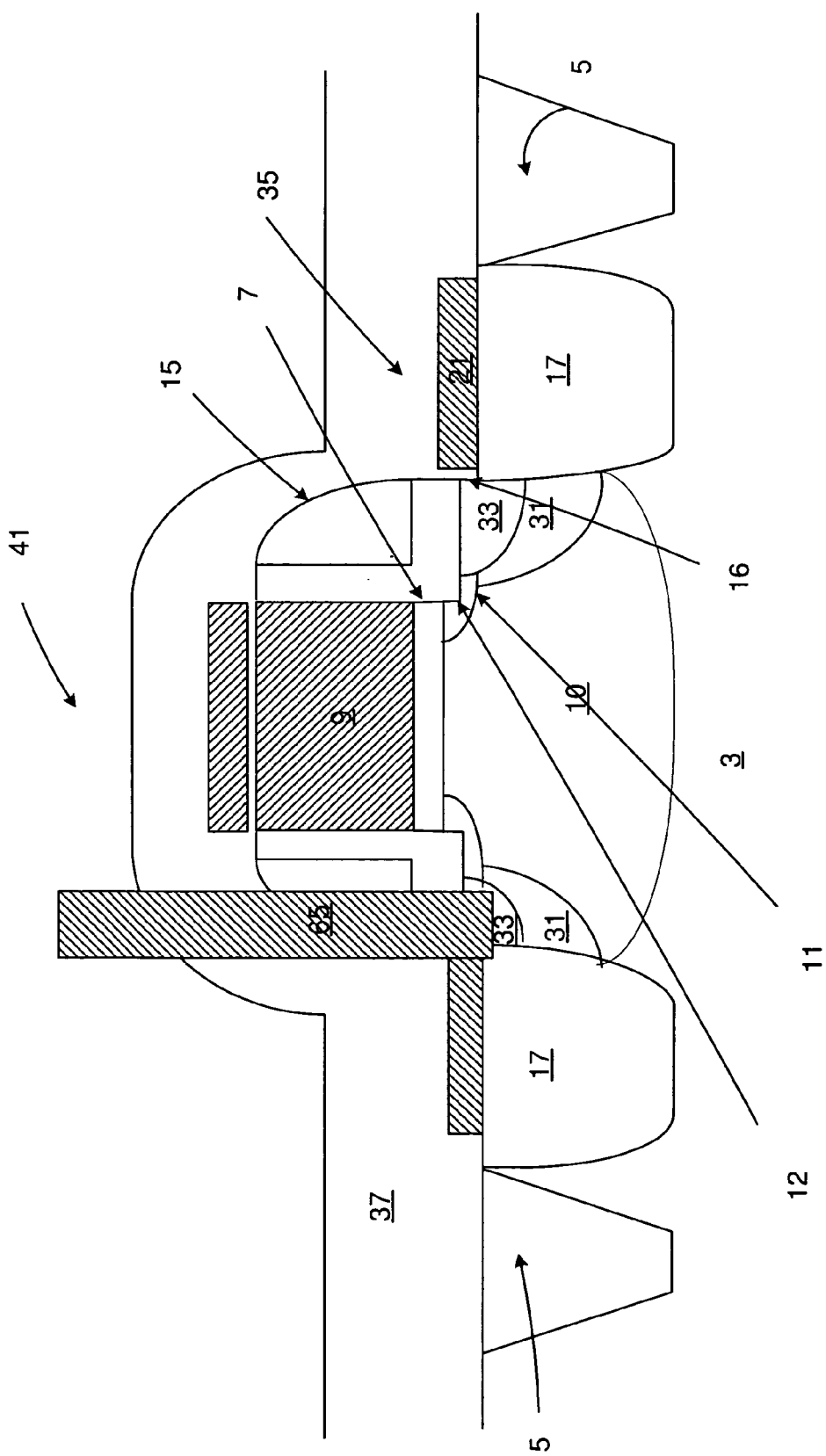
FIG. 14 illustrates, in a representative cross section, another preferred embodiment including a MOS transistor having recessed lightly dopes source/drain regions and recessed deeper source/drain regions.

In FIG. 14 a cross sectional view of yet another preferred embodiment of a MOS transistor is shown. Here, transistor 41 incorporates the source/drain pocket implants 33 and the methods described above and are further depicted with the preferred recesses 12 formed in the lightly doped source/drain regions 11. A second recessed area 16 is formed in each of the deeper source/drain regions 17 to further enhance the performance of the devices.

The preferred embodiments with recessed source and drain features as shown in FIGS. 13 and 14 are of course simplified illustrations depicting only a single transistor in each case, in a CMOS application of course there will be N and P type transistors each having been recessed either in the lightly doped source/drain regions, or in both the lightly doped source/drain regions and the deeper source/drain diffusions. Although the illustrations above only depict one or two transistors for clarity, a practical integrated circuit using the methods and structures of the invention will of course include many devices, typically thousands of transistors or more will be formed on a single integrated circuit.

Figure 15:
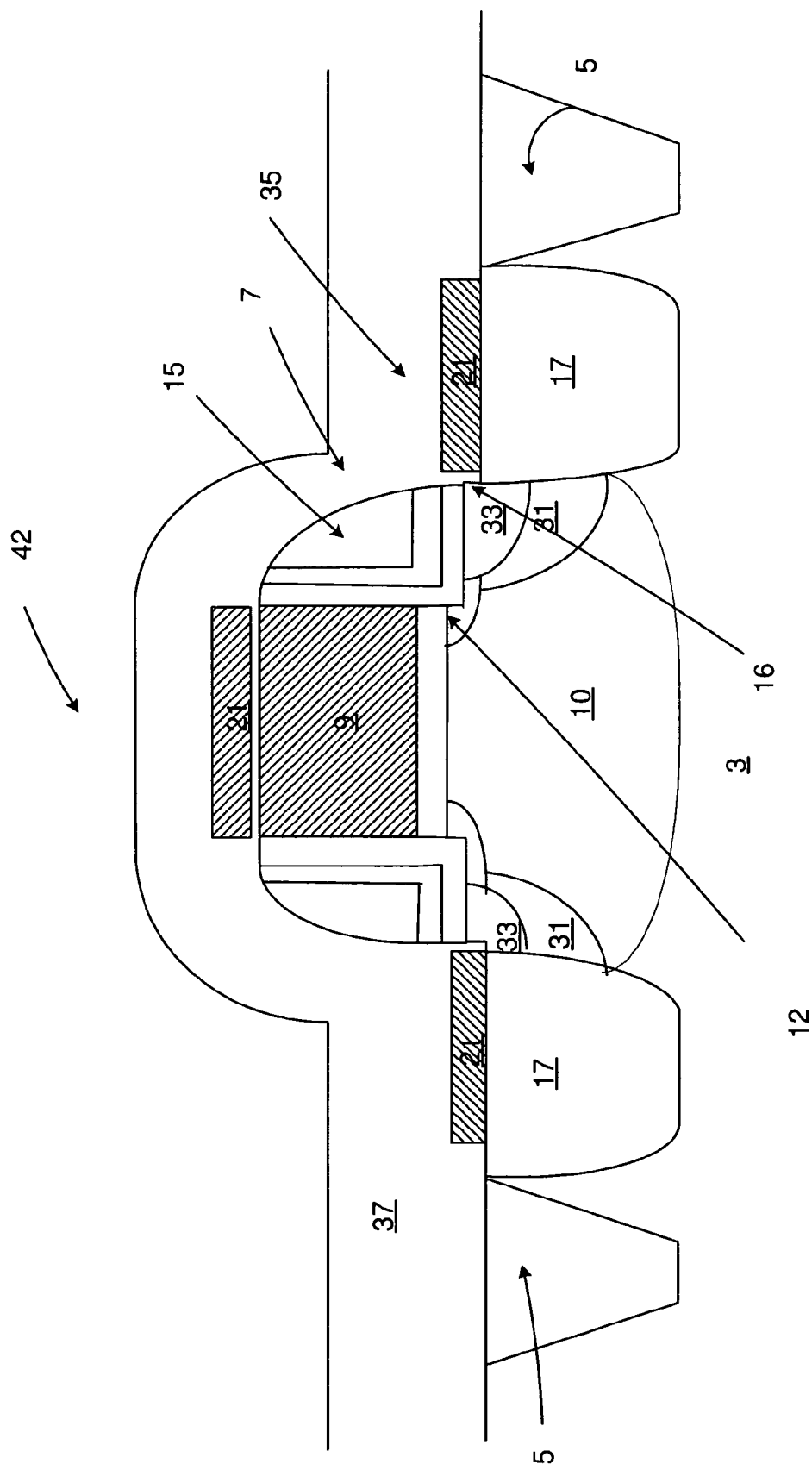
FIG. 15 illustrates, in a representative cross section, the MOS transistor of FIG. 14 in an earlier intermediate stage of manufacture.

FIG. 15 depicts in cross section another preferred MOS transistor 42 similar to that of FIG. 14 at an earlier stage of fabrication. FIG. 15 illustrates the recessed areas 12 and 16 without the contact structure 65 shown for further clarification. As described above, a variety of sidewall structures 15 may be used, in this illustrative preferred embodiment an alternative to the ON structure is shown, here an ONO structure is shown as the sidewall spacer 15.

Figure 16:
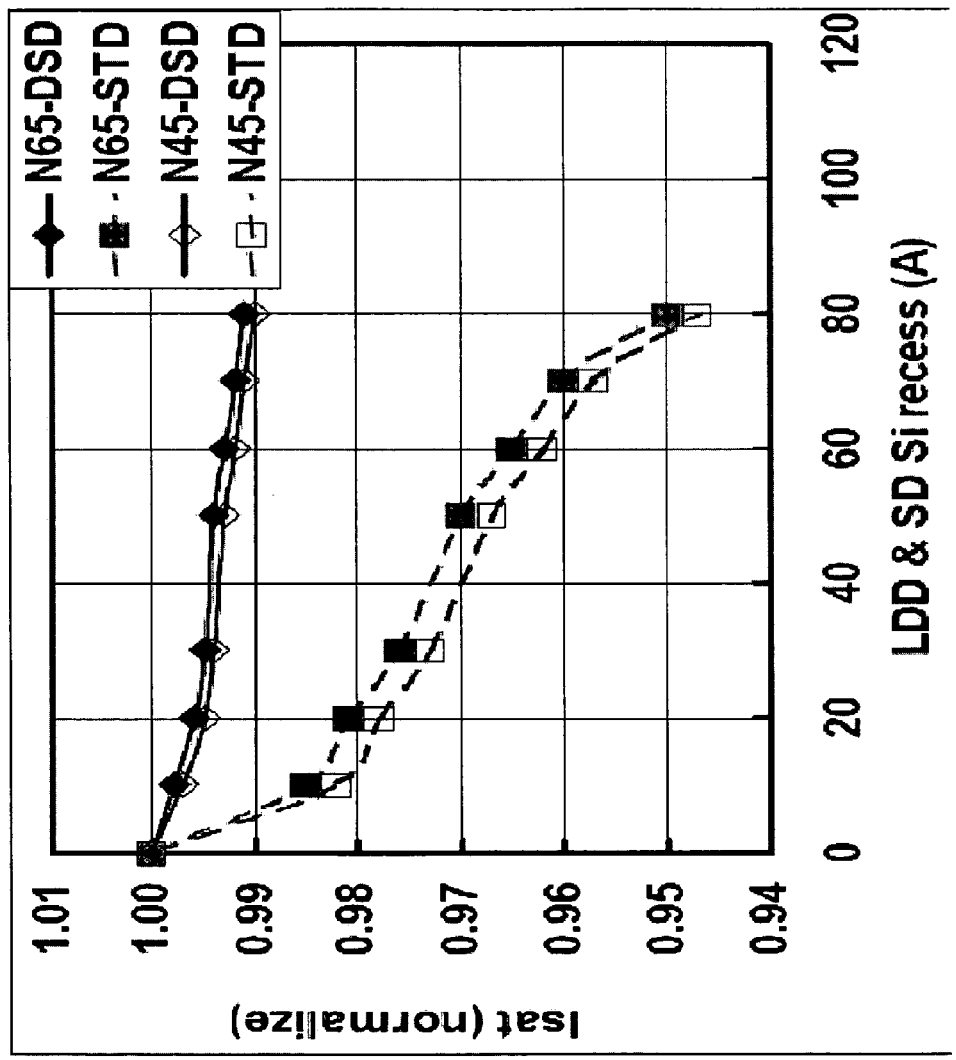
FIG. 16 depicts, in a graphical form, comparative saturation current measurements for transistors formed using preferred embodiments of the invention and for transistors formed without the use of the invention.

FIG. 16 depicts a graphical representation of normalized measurements taken of transistors formed in both 45 and 65 nanometer semiconductor process nodes, with and without the use of the pocket source/drain implants, and with a variety of recesses, to further illustrate the advantages of the use of the invention. In FIG. 16, the horizontal axis depicts the depth of the recesses formed in the source/drain regions starting at 0 Angstroms and increasing to a maximum of 80 Angstroms, although deeper recesses could be formed. The vertical axis illustrates the observed current in saturation (Isat) for a transistor formed using no recesses, and for transistors with increasingly deep recessed areas. The current is measured compared to a normalized value of 1.00 for a "no recess" case. The dashed lines represent the 45 and 65 nanometer process nodes without the pocket source/drain diffusion regions, and the solid lines represent the 45 and 65 nanometer process nodes incorporating the added pocket source/drain implanted diffusions of the invention. As can be seen, the transistors including the added source/drain diffusions have currents Isat that remain more or less constant, and close to the normalized value as the recess depths increase. In contrast, the transistors formed using the prior art structures without these added implants show a marked degradation in Isat as the recess depths increase.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor device, comprising:
   providing a semiconductor substrate;
   forming isolation regions in the semiconductor substrate and forming a plurality of active areas formed between the isolation regions;
   forming at least one gate structure in one of the active areas, the gate structure comprising a gate oxide over the substrate and a conductive gate electrode over the gate oxide and the gate structure having sidewalls, the active area beneath the gate structure forming a channel region;
   forming a lightly doped drain diffusion in the active area on either side of the gate structure sidewalls;
   forming recessed areas in the active area on either side of the gate structure sidewalls;
   forming insulating composite spacers on either side of the gate structure, the composite spacers covering the sidewalls and overlying the recessed areas; and
   forming source/drain diffusions in the active areas including angle implanted source/drain regions formed in the substrate, the source/drain regions being self aligned to the composite spacers.

2. The method of claim 1 and further comprising:
   forming a retrograde well in at least one active area prior to forming the at least one gate structure.

3. The method of claim 1, wherein forming the lightly doped drain diffusions comprises ion implantation of semiconductor dopants, followed by a thermal anneal.

4. The method of claim 1, wherein forming the isolation regions comprises forming shallow trench isolation regions.

5. The method of claim 1, wherein forming the source/drain diffusions comprises performing an angled ion implant of semiconductor dopants contemporaneously with a vertical implant of semiconductor dopants.

6. The method of claim 4 wherein the angles of the angled ion implant is between 5 and 45 degrees from vertical.

7. The method of claim 1 wherein forming the source/drain diffusions comprises performing a vertical ion implant of semiconductor dopants to form deep source/drain diffusions on either side of the composite spacers, and performing an angled ion implant of semiconductor dopants of the same type on either side of the composite spacers to form additional source/drain dopants beneath the recessed areas.

8. The method of claim 1 and further comprising forming a second recess on either side of the composite spacer after the composite spacer is formed, said second recess being larger than the first, and then subsequently performing the source/drain diffusion.

9. The method of claim 1 wherein the depth of the first recess is from about 5 Angstroms from the surface of the substrate to about 100 Angstroms from the surface of the substrate.

10. The method of claim 1 wherein the source/drain angled implants results in a source/drain implant having a depth greater than 50 Angstroms.

11. The method of claim 10 where the range of the depth of the source/drain angled implant is from about 50 Angstroms from the surface of the substrate to about 1800 Angstroms.

12. A method for forming a complementary MOS device including at least one NMOS and at least one PMOS transistor comprising:
   providing a semiconductor substrate;
   forming shallow trench isolation regions in the semiconductor substrate, the shallow trench isolation regions defining at least one active area for an NMOS transistor and at least one active area for a PMOS transistor;
   forming a retrograde well of a low mobility P type dopant atom in the semiconductor substrate in the active area for the NMOS transistor;
   depositing a gate oxide layer over the active areas;
   depositing a gate electrode material over the gate oxide layer;
   patterning gate electrode structures having sidewalls over each active area by etching the gate electrode material;
   patterning the gate oxide material to from gate oxide layers beneath the gate electrode structures;
   forming lightly doped source/drain diffusion regions in the semiconductor substrate by performing ion implants of semiconductor dopants of N and P types for the NMOS and PMOS transistors, respectively, into the substrate adjacent to the gate electrode structures, and annealing the lightly doped source/drain diffusions so that the diffusions extend partially underneath the gate electrodes, and the lightly doped source/drain diffusions define channel regions for the NMOS and the PMOS transistors;
   recessing the lightly doped source/drain diffusion regions so that the top surface of the source/drain diffusion regions lies below the gate oxide bottom surface in each active area;
   forming composite sidewall spacers over the recessed lightly doped source/drain diffusion regions and covering the sidewalls of the gate electrode structures; and
   forming source/drain diffusions by ion implanting semiconductor dopants of N and P types for the NMOS and PMOS transistors respectively using a self aligned vertical implant adjacent to the composite sidewall spacers and forming source/drain pocket diffusions underneath the recessed lightly doped source/drain diffusions by ion implanting semiconductor dopants of N and P types for the NMOS and PMOS transistors, respectively, at an angle of from 5 degrees to about 45 degrees from vertical, the source/drain pocket diffusions being positioned adjacent to the inner boundary of the source/drain diffusion and adjacent the boundary of the lightly doped source/drain diffusions in each active area.

13. The method of claim 12 and further comprising:
forming a stress layer comprising a layer overlying the active areas and gate electrodes which causes at least one of compressive or tensile stress in at least one channel region of one of the NMOS and PMOS transistors.

14. The method of claim 13 wherein the stress layer is a contact etch stop layer.

15. The method of claim 14 and further comprising, for each of the NMOS and PMOS transistors, forming a contact of conductive material that extends through the stress layer and makes electrical contact to the source/drain diffusion region.

16. The method of claim 15 wherein the contact extends through one of the composite sidewall spacers and makes electrical contact to a lightly doped source/drain diffusion region.

17. The method of claim 16 wherein the contact extends into the lightly doped source/drain diffusion region.

18. The method of claim 15 wherein the contact extends though a portion of one of the composite sidewall spacers and extends through the lightly doped source/drain diffusion and makes electrical contact with a source/drain pocket diffusion region.

19. A method for forming a complementary MOS device comprising:
forming shallow trench isolation regions in a semiconductor substrate, the shallow trench isolation regions defining at least one active area for an NMOS transistor and at least one active area for a PMOS transistor;
depositing a gate oxide layer over the active areas;
depositing a gate electrode material over the gate oxide layers;
patterning gate electrode structures having sidewalls over each active area;
patterning the gate oxide material to from gate oxide layers lying beneath the gate electrode structures;
forming lightly doped source/drain diffusion regions by performing ion implants of semiconductor dopants of N and P types for the NMOS and PMOS transistors, respectively, into the substrate adjacent to the gate electrode structures, and annealing the lightly doped source/drain diffusion region;
recessing the lightly doped source/drain diffusion regions so that the top surface of the source/drain diffusion regions lies below the gate oxide bottom surface in each active area;
forming composite sidewall spacers over the recessed lightly doped source/drain diffusion regions and covering the sidewalls of the gate electrode structures; and
forming source/drain diffusions by ion implanting semiconductor dopants of N and P types for the NMOS and PMOS transistors respectively using a self aligned vertical implant adjacent to the composite sidewall spacers, and forming source/drain pocket diffusions underneath the recessed lightly doped source/drain diffusions by ion implanting semiconductor dopants of N and P types for the NMOS and PMOS transistors, respectively, at an angle of from 5 degrees to about 45 degrees from vertical, the source/drain pocket diffusions being positioned adjacent to the inner boundary of the source/drain diffusion and adjacent to the boundary of the lightly doped source/drain diffusions in each active area;
recessing the source and drain diffusion regions to form second recessed areas such that the top surface of the recessed source and drain diffusion regions in each active area lies below the top surface of the recessed lightly doped source/drain diffusion regions; and
depositing a contact etch stop layer overlying the NMOS and PMOS transistors.

20. The method of claim 19 and further comprising, for each of the NMOS and PMOS transistors, forming a contact of conductive material that extends through the stress layer and makes electrical contact to and extends into the source/drain diffusion region.

* * * * *

UNITED STATES PATENT AND TRADEMARK OFFICE
CERTIFICATE OF CORRECTION

PATENT NO. : 7,364,957 B2 Page 1 of 1
APPLICATION NO. : 11/490012
DATED : April 29, 2008
INVENTOR(S) : Thei et al.

It is certified that error appears in the above-identified patent and that said Letters Patent is hereby corrected as shown below:

Col. 6, line 7, delete "though" and insert --through--.
    Col. 6, line 51, delete "though" and insert --through--.
    Col. 6, line 62, delete "pattered" and insert --patterned--.
    Col. 9, line 9, delete "dopes" and insert --doped--.
    Col. 12, line 51, after steps delete "are required".
    Col. 16, line 44, delete "from" and insert --form--.
    Col. 18, line 1, delete "from" and insert --form--.

Signed and Sealed this

Twenty-second Day of July, 2008

JON W. DUDAS
*Director of the United States Patent and Trademark Office*